United States Patent
Saha et al.

(10) Patent No.: US 7,423,475 B2
(45) Date of Patent: Sep. 9, 2008

(54) PROVIDING OPTIMAL SUPPLY VOLTAGE TO INTEGRATED CIRCUITS

(75) Inventors: Anindya Saha, Bangalore (IN); Vivek Gorakhnath Pawar, Bangalore (IN); Sudheer Prasad, Bangalore (IN); Anmol Sharma, Bangalore (IN); Suresh R. Puthucode, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 724 days.

(21) Appl. No.: 10/710,861

(22) Filed: Aug. 9, 2004

(65) Prior Publication Data

US 2005/0057230 A1     Mar. 17, 2005

Related U.S. Application Data

(60) Provisional application No. 60/498,304, filed on Aug. 28, 2003.

(51) Int. Cl.
    *G05F 1/10*    (2006.01)
(52) U.S. Cl. ...................................... 327/543
(58) Field of Classification Search ................ 327/543
    See application file for complete search history.

(56) References Cited

U.S. PATENT DOCUMENTS 5,648,766 A    7/1997   Stengel et al.
6,211,727 B1*  4/2001   Carobolante ............... 327/543
7,088,172 B1*  8/2006   Lesea et al. ................. 327/543
2002/0014913 A1* 2/2002 Casper ....................... 327/543

FOREIGN PATENT DOCUMENTS

JP         10322019 A      5/1997
JP       2000066746 A      8/1998

OTHER PUBLICATIONS

Peter Macken, Marc Degrauwe, Mark Van Paemel, Henri Oguey, "A Voltage Reduction Technique for Digital Systems" in ISSCC 90/ Session 15. Innovative Circuit design, Swiss Center for Electronics and Microtechnology (CSEM) Neuchel Switzerland/ FPM 15.2, pp. 238-239/ Friday, Feb. 16, 1990.
Thomas D. Burd and Robert W Brodersen, "Design Issues for Dynamic Voltage Scaling", ISLPED '00 Rapallo, Italy, Berkeley Wireless Research center, University of California, CA/ pp. 09-14, ACM, 2000.

(Continued)

*Primary Examiner*—Quan Tra
*Assistant Examiner*—Khareem E Almo
(74) *Attorney, Agent, or Firm*—Steven A. Shaw; W. James Brady; Frederick J. Telecky, Jr.

(57) ABSTRACT

A characteristic is measured on multiple portions of an integrated circuit, and the supply voltage adjusted based on the measurements. In an embodiment, the characteristic corresponds to propagation delay which indicates whether the integrated circuit is implemented with a strong, weak or nominal process corner. In general, the supply voltage can be increased in the case of a weak process corner and decreased in the case of a strong process corner.

13 Claims, 5 Drawing Sheets

OTHER PUBLICATIONS

Thomas Burd, Trovor Pering, Anthony Stratakos and Robert Brodersen, "A Dynamic Voltage Sealed Microprocessor System". ISSCC 2000/Session 17/ Logic and Systems/Paper WA 17.4, Berkeley Wireless Research center, University of California, CA, pp. 294-295, 466, IEEE 2000.

Tajana Simunic, Luca Benini, Andrea Acquaviva, Peter Glynn and Giovanni De Micheli. Dynamic Voltage Scaling and Power Management for Portable Systems, pp. 524-529, Las Vegas, Nevada, USA, DAC 2001, Jun. 18-22, 2001.

Kevin J. Nowka, Gary D.Carpenter, Eric W. Mac Donald, Hung C. Ngo, Bishop C. Brock, Koji I. Ishii, Tuyet Y. Nguyen and Jeffrey L. Burns. A 32-bit PowerPC System-on-a-Chip with support for Dynamic Voltage Scaling and Dynamic Frequency Scaling, in IEEE Journal of Solid State Circuits vol. 37, pp. 1441-1447, No. 11 Nov. 2002.

Rex Min, Travis Furrer and Anantha Chandrakasan,"Dynamic Voltage Scaling Techniques for Distributed Microsensor Networks", Department of EECS, Massachusetts Institute of Technology. 2002.

Mohamed Elgebaly, Amr Fahim, Inyup Kang and Manoj Sachdev, "Robust and Efficient Dynamic Voltage Scaling Architecture" Department of Electrical and Computer Engineering, University of Waterloo, Ontario, N2L 3G1 Canada, Qualcomm Inc, San Diego, CA, 92121 USA.in IEEE, pp. 155-158, 2003.

A.Soto. A De Castro, P. Alou, J.A. Caobos, J. Uceda and A. Lotfi. "Analysis of the Buck Converter for Scaling the Supply Voltage of Digital Circuits". Universidad Politecinica de Madrid(UPM), Spain and Enpirion Inc, USA, in IEEE, pp. 711-717, 2003.

* cited by examiner

| PROCESS/VOLTAGE | 1.35V | 1.42V | 1.5V | 1.55V | 1.65V |
|---|---|---|---|---|---|
| WEAK PROCESS | F11 | F12 | F13 | F14 | F15 |
| NOMINAL PROCESS | F21 | F22 | F23 | F24 | F25 |
| STRONG PROCESS | F31 | F32 | F33 | F34 | F35 |

FIG. 10

| PROCESS/VOLTAGE | 1.35V | 1.42V | 1.5V | 1.55V | 1.65V |
|---|---|---|---|---|---|
| WEAK PROCESS | C11 | C12 | C13 | C14 | C15 |
| NOMINAL PROCESS | C21 | C22 | C23 | C24 | C25 |
| STRONG PROCESS | C31 | C32 | C33 | C34 | C35 |

FIG. 11

FIG. 12 ized need to adjust the supply voltage dynamically during the operation of an integrated circuit.

US 7,423,475 B2

PROVIDING OPTIMAL SUPPLY VOLTAGE TO INTEGRATED CIRCUITS

CROSS REFERENCE TO RELATED APPLICATIONS

The present application is related to and claims priority from co-pending US provisional patent application entitled, "Providing Optimal Supply Voltage to Integrated Circuits", Filed on: Aug. 28, 2003, Ser. No. 60/498,304, naming as inventors: SAHA et al, and is incorporated in its entirety herewith into the present application.

BACKGROUND OF INVENTION

1. Field of the Invention

The present invention relates to integrated circuits, and more specifically to a method and apparatus for providing optimal supply voltage to integrated circuits.

2. Related Art

Integrated circuits (ICs) are generally driven by supply voltages. Various components (e.g., transistors) in the ICs require the supply voltage during operation as is well known in the relevant arts.

It may be desirable to provide optimal supply voltage to ICs. As an illustration, a high supply voltage generally leads to low propagation delays which may be useful in increasing the throughput performance of an IC. However, a substantially higher supply voltage may lead to unusability of ICs due to gate oxide layer failure, etc.

On the other hand, a low supply voltage minimizes such failures, but could lead to high propagation delay (and a correspondingly slower speed of operation) in the operation of an IC.

At least for such reasons, there is a recognised need to adjust the supply voltage dynamically during the operation of an integrated circuit.

BRIEF DESCRIPTION OF DRAWINGS

The present invention will be described with reference to the following accompanying drawings.

DETAILED DESCRIPTION

1. Overview

An integrated circuit (IC) provided according to an aspect of the present invention contains multiple portions (on the silicon die), which generate respective signals (digital or analog) providing a measure of a characteristic (e.g., propagation delay) of the corresponding portion. A power management block adjusts the supply voltage based on the measured values. Due to such measurements at different portions of an integrated circuit, the supply voltage can be adjusted taking into consideration the status at several portions of the integrated circuit.

In an embodiment of the present invention, each measurement indicates whether the corresponding portion is fabricated using strong, nominal or weak process, and the voltage is adjusted to derive higher throughput performance from portions of weak process corner, while ensuring that even the portions of strong process corner are not exposed to voltages exceeding acceptable threshold value. As a result, integrated circuits of weak process corners can also be potentially used to attain a desired throughput performance, thereby increasing the overall yield (percentage of acceptable units of IC) in a fabrication environment.

Another aspect of the present invention integrates the power management block also into the integrated circuit, which may provide several advantages. In one embodiment, a non-volatile memory (e.g., in the form of an efuse) is programmed with an adjustment value, which controls the strength of the supply voltage at the time of initialization. The supply voltage may be adjusted further according to various features of the present invention. However, by measuring the strength of the process corner (for example, while testing/qualifying the IC) and setting the value in the non-volatile memory according to the optimal desired voltage, the supply voltage can be adjusted quickly to an optimum desired voltage.

One more aspect of the present invention reduces the number of transistors by using a multiplexor to receive the measured values, and processing the measured values using a shared circuit. Die size and power consumption requirements may be minimized as a result.

Various aspects of the present invention are described below with reference to an example problem. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Integrated Circuit

Figure 1:
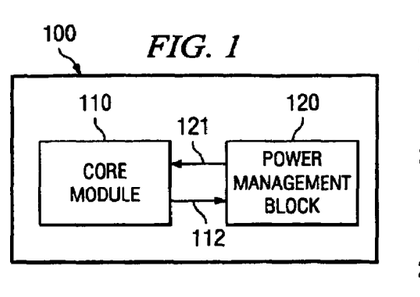
FIG. 1 is a block diagram of a die illustrating an example device in which the present invention may be implemented.

FIG. 1 is a block diagram of an integrated circuit illustrating an example environment in which the present invention may be implemented. Integrated circuit 100 is shown containing core module 110 and power management block 120. Both core module 110 and power management block 120 may be fabricated/implemented on a single die. In an embodiment, the core module 110 consists of everything on the die/chip minus/except the power management block 120 (if it is on_chip).

Power management block 120 provides the supply voltage on path 121 to core module 110 based on a control signal received on path 112. Power management block 120 is designed such that the supply voltage provided on path 121 can be adjusted based on control signal 112. Power management block 120 is shown implemented in integrated circuit 100, however power management block 120 can be implemented external to integrated circuit 100 as well.

Core module 110 may be designed to perform various operations to support various user applications, as desired. Integrated circuit 100 may operate in one of different process corners due to the variations (or unpredictability) that are typical of semiconductor manufacturing processes, temperature, voltage, etc. Similarly, different portions of a single integrated circuit (IC) may also operate in different process corners due to similar reasons.

In general, the speed of operation of a portion of an IC is low if the corresponding process corner is weak and the speed of operation is high if the process corner is strong. In a prior approach, an IC may be deemed to be unacceptable to provide a desired throughput performance if the IC is fabricated at a weak process corner. An aspect of the present invention may enable some of such ICs to be used, in addition to ensuring that ICs operate at an appropriate speed (performance) as described below with reference to FIG. 2.

3. Method

Figure 2:
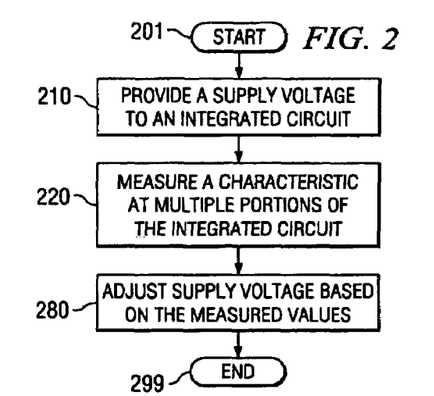
FIG. 2 is a flowchart illustrating a manner in which the supply voltage for/of an integrated circuit may be adjusted according to an aspect of the present invention.

FIG. 2 is a flowchart illustrating a manner in which the performance of an integrated circuit may be adjusted according to an aspect of the present invention. The method is described with reference to FIG. 1 for illustration. However, the method may be implemented in other environments as well. The method begins in step 201, in which control immediately passes to step 210.

In step 210, a supply voltage is provided to an integrated circuit (IC). With reference to FIG. 1, power management block 120 provides supply voltage to core module 110. In general, supply voltage is required for operation of various components in the integrated circuit.

In step 220, a characteristic is measured at multiple portions of the IC. In an embodiment, propagation delay at each portion is measured and the propagation delay represents the process corner at the portion.

In step 280, the supply voltage is adjusted based on the measured (analog/digital) values. In an embodiment described in sections below, the core module sends a control signal to the power management block to adjust the supply voltage. For example, core module 110 sends a control signal to increase the supply voltage if the propagation delay is high (i.e., in case of a weak process corner). The method then ends in step 299.

From the above, it may be noted that a desired performance level may be attained for an IC by appropriate adjustment of the supply voltage irrespective of the process corner at which the IC (or portions) is manufactured to operate at. As a result, integrated circuits with weak or strong process corners may also be put into use, thereby increasing the effective yield. In addition, the change in the characteristic due to temperature, voltage, etc., may also be automatically adjusted due to the operation of various features. The description is continued with reference to an example integrated circuit, which measures a characteristic and adjusts the supply voltage.

4. Example Integrated Circuit

Figure 3:
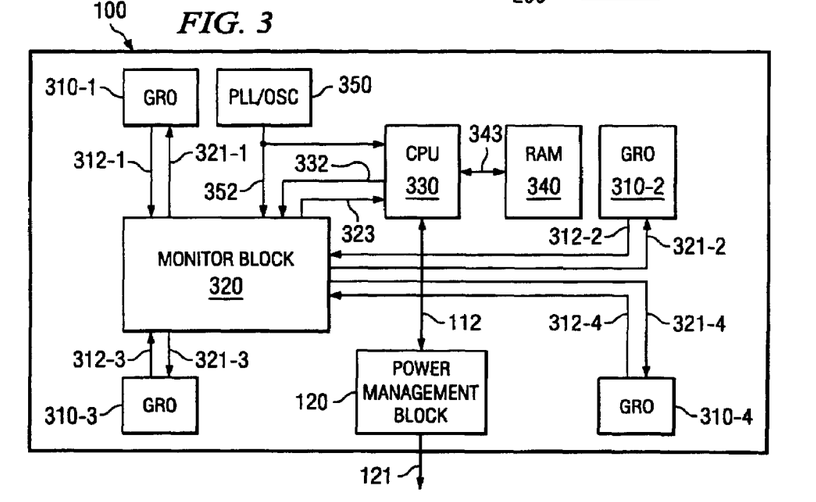
FIG. 3 is a block diagram illustrating the details of an example integrated circuit implemented according to an aspect of the present invention.

FIG. 3 is a block diagram illustrating the details of an example integrated circuit, which adjusts the supply voltage according to an aspect of the present invention. Integrated circuit 100 is shown containing four gated ring oscillators (GROs) 310-1 through 310-4, monitor block 320, central processing unit (CPU) 330, random access memory (RAM) 340, phase locked loop (PLL) or crystal oscillator (OSC) 350 and power management block 120. The components are described below in further detail.

Merely for conciseness, only the components relevant to the operation of an embodiment of the present invention are shown contained in integrated circuit 100. However, integrated circuit 100 may contain several other components. Typically, integrated circuit contains other portions (not shown) which may be used to implement various user applications (e.g., processing an analog signal or digital data), and such portions which implement the user applications is conveniently referred to as an application block.

As may be readily noticed from FIG. 3, each GRO/portion is at a corresponding area on the IC. The areas are non-contiguous, implying that different GROs/portions measure the corresponding place/area of the IC. In particular, GROs 310-1, 310-2, 310-3 and 310-4 are respectively shown in top left, top right, bottom left and bottom right areas in the example scenario there.

GROs 310-1 through 310-4 operate as measurement blocks, and may be placed in specific portions of the IC at which a characteristic (e.g., speed or propagation delay) of interest is sought to be measured. Each of GROs 310-1 through 310-4 generates a respective signal on corresponding one of paths 312-1 through 312-4 representing the propagation delay corresponding to the surrounding portion where the GRO is placed. In an embodiment, each GRO output signal represents a square wave, and accordingly the time period of the GRO output signal represents the propagation delay.

In addition, GROs 310-1 through 310-4 are shown receiving GRO_EN signal on respective paths 321-1 through 321-4. GROs 310-1 through 310-4 are enabled/operational for one logical value of GRO_EN signal and nonoperational for another logical value of GRO_EN signal.

Monitor block 320 receives the signals from GROs 310-1 through 310-4 on respective paths 312-1 through 312-4, and provides count (measured) values on path 323 representing the propagation delays at different portions. In an embodiment, monitor block 320 contains a counter, which counts the number of cycles of clock signal 325 during certain state (for example, period when the signal is at logical high level) of each of the signals 312-1 through 312-4 to generate corresponding count values.

In an alternative embodiment, the counter counts the number of cycles in the signal on paths 312-1 through 312-4 during a fixed duration (for example, 1 milli second). The counted value again represents the propagation delay at the portion and is provided as the count value on path 323. Control signals on path 332 enables the same counter to be used associated with all the GROs, thereby decreasing the circuit complexity. An example use of control signals on path 332 is described below with reference to the details of monitor block 320 associated with FIG. 6.

CPU 330 performs various operations on the received count values on path 323 and generates a signal on path 112 to adjust the supply voltage accordingly. CPU 330 also provides control signals on path 332 to control various operations in monitor block 320. In an embodiment, CPU 330 generates the signal on path 112 based on an average of all the count values.

In an alternative embodiment, the largest count value among the four values is used to generate the signal on path 112 as described in sections below. The largest count value represents weak process corner since weak process corner has high propagation delay. As an illustration, if the average/largest count value represents weak process corner, CPU 330 sends the signal to increase the supply voltage.

CPU 330 receives information on path 343 whether the process corner is weak, nominal or strong for the corresponding average or largest count value (of the respective two embodiments noted above). In an embodiment, RAM 340 contains a lookup table indicating whether the process corner is weak, strong or nominal corresponding to the (average/largest) count value and the present supply voltage level. An embodiment of the lookup table is described with reference to FIG. 10 in sections below. RAM 340 provides on path 343 data indicating whether the process corner is weak, strong or nominal corresponding to the received count value on path 323.

It may be noted that once the count values representing the process corner are determined, CPU 330 CPU 330 programs power management block 120 to adjust the supply voltage. Such adjustment may be performed by using instructions consistent with an interface provided by power management block 120.

Power management block 120 adjusts the supply voltage to integrated circuit 100 based on the signal received on path 112. The manner in which power management block 120 may be implemented according to several aspects of the present invention is described below with reference to FIG. 4.

5. Power Management Block

Figure 4:
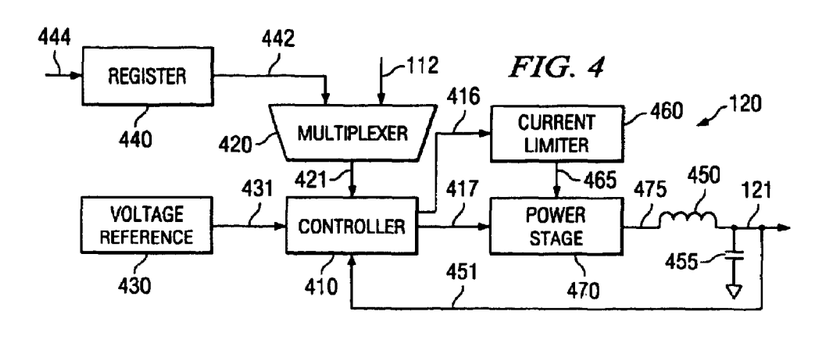
FIG. 4 is a block diagram illustrating the details of a power management block implemented according to an aspect of the present invention.

FIG. 4 is a block diagram illustrating the details of power management block 120 in an embodiment of the present invention. Power management block 120 is shown containing controller 410, multiplexer 420, voltage reference 430, register 440, inductor 450, capacitor 455, current limiter 460 and power stage 470. Each component is described below.

Inductor 450 and capacitor 455 together form a filter, which generates a d.c. voltage on path 121 in response to the pulses received on path 475. During the initial power up, capacitor 455 charges from 0V to the desired voltage level by a constant current received from power stage 470. In addition, capacitor 455 charges to the desired voltage level by a current received from power stage 470 when code on path 421 changes representing the desired change in output voltage.

Power stage 470 converts the pulses received on path 417 in to pulses with high power on path 475 in normal mode (constant voltage mode). Power stage 470 provides constant current to capacitor 455 to charge to the desired voltage level in a constant current mode based on the signal received on path 417. Power stage 470 switches to constant voltage mode when the signal on path 417 represents constant voltage mode, which may be generated when capacitor 455 charges to the desired voltage level.

Current limiter 460 controls the operation of power stage 470 to provide the required high current to capacitor 455 while capacitor 455 charges to the desired voltage level. In an embodiment, current limiter 460 sends a signal on path 465 representing constant current mode, in response to which power stage 470 provides the desired current to capacitor 455. Current limiter 460 generates another signal on path 465 when the signal received on path 416 indicates that capacitor 455 is charged to the desired voltage level, causing power stage 470 to operate in normal mode.

Controller 410 receives reference voltage on path 431 and output voltage on path 451, and generates pulses on path 417. The duty cycle (ratio of time duration of logic 1 to cycle time) of the pulses is computed based on the difference of voltages received on paths 431 and 451, and code received on path 421. In general, the duration of logic 1 is increased to increase the voltage level (either in response to digital code indicating a need to increase the voltage or the voltage level received on path 451 in comparison to the reference voltage 431).

Controller 410 also generates a signal on path 416 when the code received on path 421 requires a change of the voltage on capacitor 455. Controller 410 detects whether capacitor 455 is charged to the desired voltage level and disables the signal on path 416 (if the capacitor is charged), which causes power management block 120 to be operated in normal mode.

Voltage reference 430 generates a reference voltage on path 431, which represents the initial voltage level to be provided to various components in integrated circuit 100. Reference voltage 431 may be generated to be a constant voltage independent of temperature, pressure, etc., variations.

Register 440 stores a fixed code (adjustment value) received on path 444. In an embodiment, process corner of integrated circuit 100 is determined during testing of the die and adjustment value 444 to attain the desired voltage level is generated by a test equipment (not shown) based on the process corner. As a result, the optimal desired voltage may be quickly attained during the initialization phase. In an embodiment, power management block 120 is integrated with the integrated circuit in the same die, and register 440 may be particularly useful in such embodiments.

Multiplexer 420 receives fixed code on path 442 and variable code on path 112, which represents the desired voltage level (or change thereto) during the operation of an integrated circuit. Multiplexer 420 selects one of the two codes received on paths 442 and 112 and provides the selected code on path 421. The description is continued with respect to the details of GRO (gated ring oscillator) in one embodiment.

6. Gated Ring Oscillator

Figure 5A:
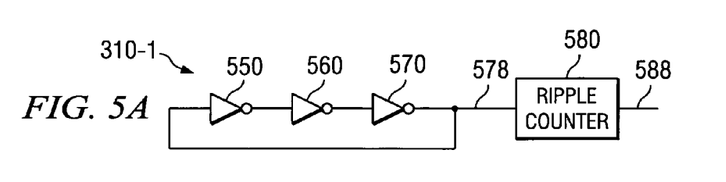
FIG. 5A is a circuit diagram illustrating the details of a gated ring oscillator (GRO) in one embodiment.
Figure 5B:
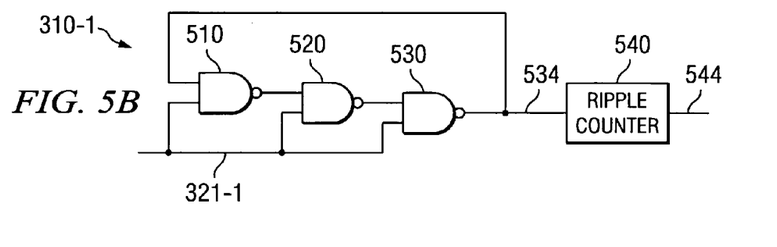
FIG. 5B is a circuit diagram illustrating the details of a gated ring oscillator in an alternative embodiment.

FIGS. 5A and 5B are circuit diagrams, each illustrating the details of gated ring oscillator 310-1 in one embodiment. Merely for illustration, the details of gated ring oscillator 310-1 is described, however, gated ring oscillators 310-2, 310-3 and 310-4 may also be implemented similarly. Continuing with reference to FIG. 5A, gated ring oscillator 310-1 is shown containing inverters 550, 560 and 570, and ripple counter 580. Each component is described below.

Inverters 550, 560 and 570 (in an odd number) are connected in a ring structure, which together generate a square wave on path 578. The time period of the square wave represents the propagation delay of inverters 550, 560 and 570. The propagation delay in turn depends on the process corner of the portion surrounding to the inverters. Thus, the time period of the square wave represents the process corner surrounding the portion where GRO 310-1 is implemented in integrated circuit 100. Merely for conciseness, GRO 310-1 is shown containing only three inverters, however, GRO 310-1 may be implemented with any odd number of inverters to form the ring structure, as would be apparent to one skilled in the relevant arts.

Ripple counter 580 receives the square wave on path 578, and generates another square wave having a smaller frequency on path 588. Using the ripple counter generally increases the precision/resolution of measurement of the propagation delay (as described in sections below). In an embodiment, ripple counter 580 is implemented as a 9-bit counter, which results in the signal on path 588 having a time period of 512 times that of the signal on path 578. Using more bits in the ripple counter generally leads to better precision.

From the above, it may be noted that the time period of the square wave signal on path 588 represents the propagation delay of GRO 310-1. An alternative implementation of GRO 310-1 is described below with reference to FIG. 5B.

FIG. 5B is a circuit diagram illustrating the details of GRO 310-1 in an alternative embodiment. GRO 310-1 of FIG. 5B is shown containing NAND gates 510, 520 and 530, and ripple counter 540. NAND gates 510, 520 and 530, and ripple counter 540 together generate a square wave signal on path 544 similar to the signal on path 588 of FIG. 5A.

Ripple counter 540 operates similar to ripple counter 580 and NAND gates 510, 520 and 530 operate similar to inverters 550, 560 and 570 except that NAND gates 510, 520 and 530 receive GRO_EN signal on path 321-1. As described above with reference to FIG. 3, GRO_EN 321-1 is used to start/stop the operation of GRO.

If GRO_EN 321-1 is at logic high, NAND gates 510, 520 and 530 together generate a square wave signal on path 534. Ripple counter 540 generates on path 544 a square wave having a higher frequency from the square wave received on path 534. If GRO_EN 321-1 is at logic low, NAND gates 510, 520 and 530 together stop generating the square wave signal, and provide a logic high value on path 534.

Thus, it may be appreciated that GRO_EN signal 321-1 starts the operation of GRO when at logic high and stops the operation when at logic low. The manner in which monitor block 320 uses the low frequency square wave signals on path 588/544 to generate a count value is described below with reference to FIGS. 6, 7, and 8.

7. Monitor Block

Figure 6:
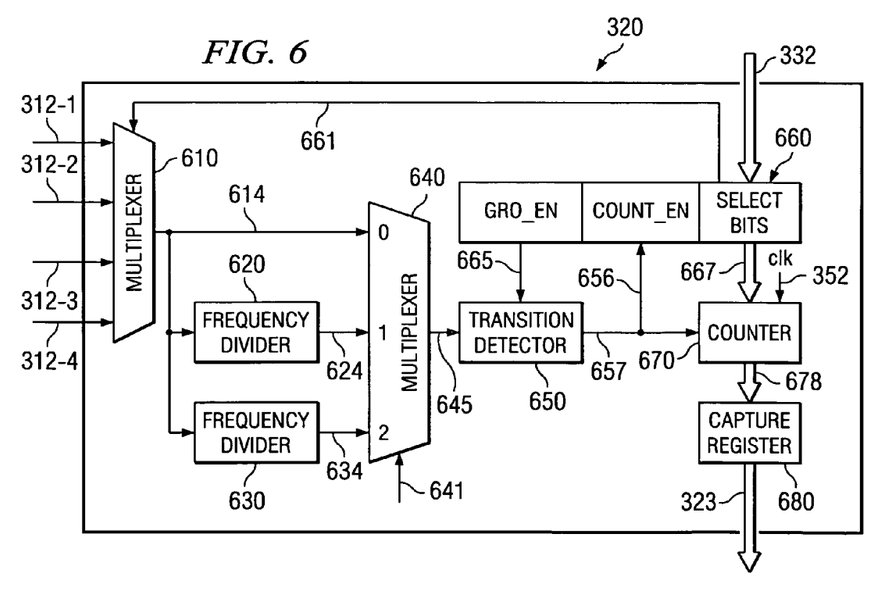
FIG. 6 is a block diagram illustrating the details of a monitor block in an embodiment of the present invention.

FIG. 6 is a block diagram illustrating the details of monitor block 320 in an embodiment of the present invention. As described above, broadly, monitor block 320 generates a count value representing the frequency of the a signal received from a corresponding GRO. Based on the count values, CPU 330 determines the process corner and the corresponding change to be made in supply voltage. Monitor block 320 is shown containing multiplexers 610 and 640, frequency dividers 620 and 630, transition detector 650, control register 660, counter 670 and capture register 680. Each component is described below.

Control register 660 is shown containing GRO_EN bit, COUNT_EN bit and select bits. However, control register 660 may contain more number of bits as required. The bits of control register 660 are received on path 332 and are send by CPU 330. GRO_EN bit is used to enable each GRO 310-1 through 310-4, transition detector 650 and counter 670. COUNT_EN bit is used to enable counter 670 and select bits are used to select one out of four GRO output signals 312-1 through 312-4.

Multiplexer (MUX) 610 selects a GRO output signal received on paths 312-1 through 312-4 based on select bits received on path 661. The select bits are set by CPU 330 as described above. The selected GRO output signal is provided on path 614. Due to the use of multiplexor 610, several components (transition detector 650, control register 660, counter 670, capture register 680, etc.) may be shared to process the output signals received from all the GROs, thereby reducing the area requirements.

Frequency dividers 620 and 630 divide the frequency of the selected GRO output signal received on path 614 and provide the lower frequency (high time period) GRO output signal on respective paths 624 and 634. The high time period GRO output signal may increase the resolution (precision) of the measurement of the count value. In an embodiment, frequency dividers 620 and 630 are implemented to divide by 2 and 4 respectively.

Multiplexer 640 selects one of the signals received on paths 614, 624 and 634 based on the resolution select signal RES_SEL 641 contained in path 323 of FIG. 3. Multiplexer 640 provides the selected signal on path 645.

Transition detector 650 detects the transitions (either falling or rising) of the signal on path 645 and generates pulses on path 657 indicating the time points of transitions. Transition detector 650 starts detecting transitions when GRO_EN received on path 665 is high. As described below, counter 670 counts the number of cycles of clock 352 between two successive transitions.

Counter 670 starts counting the cycles/pulses in clock signal clk 352 when both of GRO_EN and COUNT_EN are high, and a transition pulse is received from transition detector 650 on path 657. Counter 670 stops counting when the next transition pulse is received on path 657. In an alternative embodiment, counter 670 receives the square wave signal on path 645 directly (without transition detector 650 in the path), and counts the number cycles or pulses in the signal received on path 645 during certain time period (for example, 1 millisecond). The time period to measure may be specified by enabling the COUNT_EN bit, and disabling the bit when the count is to stop. The count value is provided on path 678.

Capture register 680 stores the count value received on path 678 at the start of falling edge transition detected on 657. CPU 330 checks COUNT_EN bit in control register 660 and reads the count value from capture register 680 on path 323 when COUNT_EN bit is zero (disabled). After reading the count value, CPU 330 initializes (e.g., sets select bits, GRO_EN with appropriate values) control register 660 for next operation. The description is continued with reference to a timing diagram illustrating various signal changes in monitor block 320.

8. Timing Diagram

Figure 7:
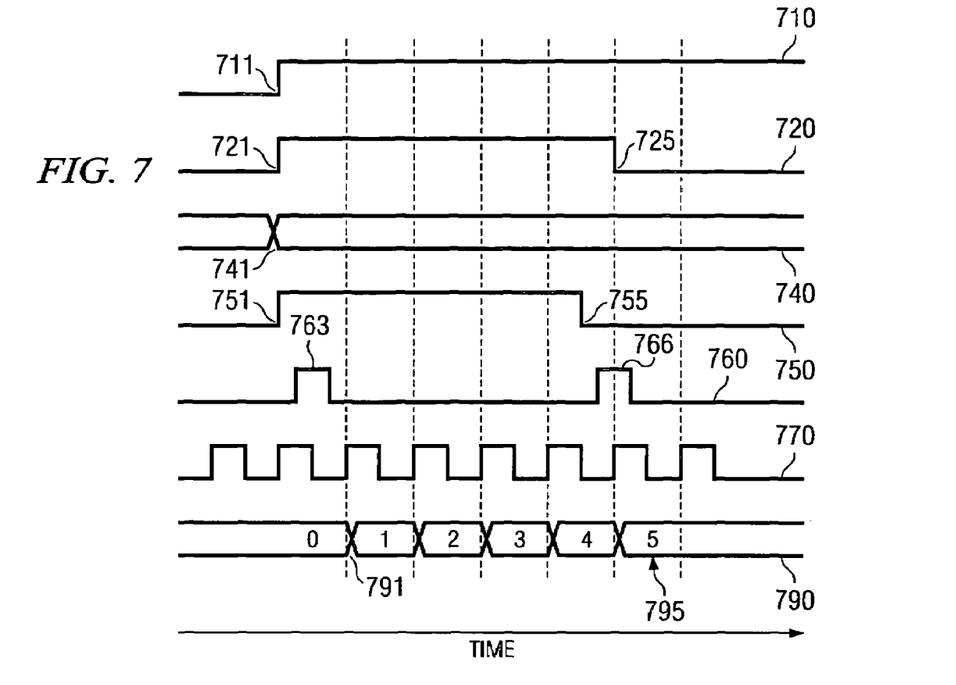
FIG. 7 is a timing diagram depicting the details of changes in various signals in the monitor block in an embodiment of the present invention.

FIG. 7 is a timing diagram depicting the details of changes in various signals in the monitor block in an embodiment of the present invention. Lines 710, 720, 740, 750, 760, 770, and 790 represent GRO_EN, COUNT_EN, select bits 661, selected GRO output signal 645, transition pulses 657, clock 352 and count value 678 respectively.

Line 710 is shown at logic high after time point 711. The logic high enables the operation of transition detector 650 and counter 670. Line 720 is shown at logic high between time points 721 and 725 and at logic low after time point 725. The logic high (of line 720) enables counter 670 to count, and logic low at/after time point 725 enables CPU 330 to read the count value from capture register 680. As noted above, the logic high of COUNT_EN is set by CPU 330 and the logic low of COUNT_EN is set based on the output of transition detector 650.

Line 740 is shown changing value at time point 741, with the changed value representing the GRO output signal to be selected by multiplexer 610. As described above, a count value is generated representing the propagation delay of the signal generated by the corresponding GRO. Line 750 is shown changing from logic low to logic high (rising edge transition) at time point 751 and from logic high to logic low (falling edge transition) at time point 755. Line 750 represents the selected output GRO signal. example, if line 740 indicates the select bits of 01, line 750 represents the GRO output signal on path 312-2.

Line 760 is shown containing transition pulses 763 and 766. Transition pulses 763 and 766 represents the rising edge transition and falling edge transition of line 750 respectively. Transition pulse 763 enables counter 670 to start counting, and transition pulse 766 enables counter 670 to stop counting. Transition pulse 766 also causes line 720 to change to logic low.

Line 790 is shown with count values incrementing by one in each successive cycle of line 770 after transition pulse 763 starting at time point 791. Line 790 is shown staying at the last count value after transition pulse 766 at time point 795. The count value after time point 795 represents the propagation delay of GRO output signal 645.

It may be noted that line 790 represents the count value indicating the number of cycles in clock signal 352 during the high period of GRO output signal 645. The signal changes in an alternative embodiment of determining the count value is described below with reference to FIG. 8.

9. Timing Diagram in an Alternative Embodiment

Figure 8:
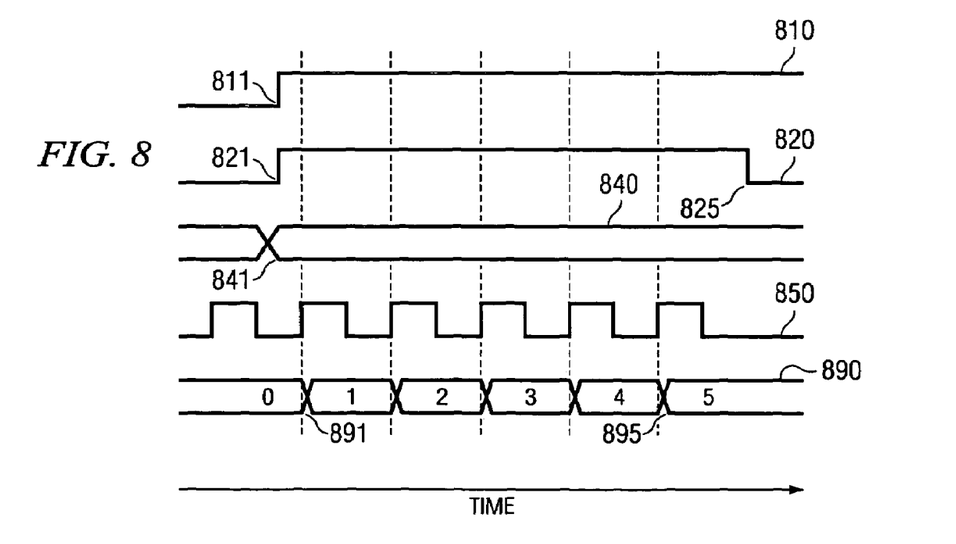
FIG. 8 is a timing diagram depicting the details of changes in various signals in the monitor block in an alternative embodiment of the present invention.

FIG. 8 is a timing diagram depicting the details of changes in various signals in the monitor block in an alternative embodiment of the present invention. In the alternative embodiment, counter 670 counts the number of cycles/pulses in the selected GRO output signal during the logic high period of COUNT_EN bit. The high period may be set/programmed by CPU 330. Lines 810, 820, 840, 850 and 890 represent GRO_EN, COUNT_EN, select bits 661, selected GRO output signal 645 and count value 678 respectively.

Line 810 is shown at logic high after time point 811. The logic high enables the operation of transition detector 650 and counter 670. Line 820 is shown at logic high between time points 821 and 825, and at logic low after time point 825. The logic high enables counter 670 to start counting and logic low at time point 825 stops counter 670 from counting. The logic low at time point 825 also enables CPU 330 to read the count value from capture register 680.

Line 840 is shown changing value at time point 841, representing the GRO output signal to be selected to determine the count value corresponding to the propagation delay of the signal. For example, if line 840 indicates the select bits of 01, line 850 represents the GRO output signal on path 312-2.

Line 890 is shown with count values incrementing by one in each successive cycle of line 850 after the rising edge of line 820 starting at time point 891. Line 890 is shown staying at the last count value after the falling edge of line 820 at time point 895. The count value after time point 895 represents the propagation delay of GRO output signal 645.

It may be noted that line 890 represents the count value indicating the number of cycles in the selected GRO output signal during the high period of COUNT_EN bit. The manner in which the count values may be used to determine the process corner of an integrated circuit is described below.

10. Determining the Process Corner

Figure 9:
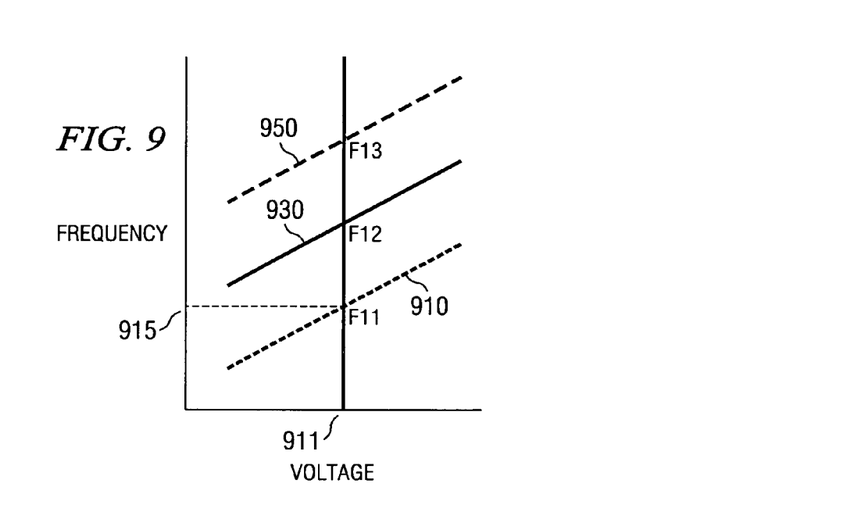
FIG. 9 is a graph illustrating the manner in which the speed of operation changes with different supply voltages for integrated circuits implemented with weak, strong and nominal process corners.

FIG. 9 is a graph depicting the details of a process corner with respect to supply voltage in an embodiment of the present invention. X-axis represents the change in supply voltage and Y-axis represents the corresponding change in frequency (and thus speed of operation) of GRO output signal. Lines 910, 930, and 950 represent the change in frequency corresponding to weak, nominal and strong process corners respectively.

Lines 910, 930 and 950 are drawn by pre-characterizing the GROs. As may be readily appreciated, for the same voltage, a GRO operating in strong process corner operates at a higher speed compared to a GRO operating in a weak process corner. Thus, for a voltage equaling point 911, GROs at weak, nominal and strong process corners operate with respective frequencies of F11, F12, and F13, with (F13>F12>F11), wherein '>' represents the greater than logical relationship.

According to an aspect of the present invention, the process corner of the circuit (or portion thereof) is determined, and the voltage may be adjusted to operate the circuit at an optimal speed/voltage. The manner in which the process corner may be determined is described below.

In an embodiment described above with reference to FIG. 6, the count value indicates the frequency of the GRO output signal. For example, assuming that a supply voltage corresponding to point 911 is used, and a frequency equaling point 915 is determined for a GRO, the operating point may be determined to be F11, which falls in the weak process corner, as shown in FIG. 9. Similarly, the operating point (as a combination of voltage and frequency) may be determined for each GRO, and a determination can be made as to whether the corresponding portion is operating in strong, weak or nominal process corner.

If the process corner is weak, the supply voltage needs to be increased to operate the integrated circuit similar to the conditions of nominal process corner. The manner in which an appropriate supply voltage may be determined is described below in detail with reference to FIG. 11. It may be helpful to understand the theory first and accordingly the theory on the range of supply voltage selection is described below first.

11. Theory

In general, the maximum and minimum supply voltages that can be applied to an integrated circuit at different process corners depends on the manufacturing technology. The maximum voltage for weak/nominal process corner IC can be selected higher than a maximum permissible voltage for a specified technology without much risk of damage over the life time of the transistor. For example, in one embodiment, a maximum voltage greater than 1.65V may be applied in case of circuits with weak or strong process corners even though 1.65V is specified as the maximum permissible voltage. However, it is generally desirable not to use such excessive supply voltage in case of a strong process corner, as such voltages can reduce the life time of the transistors and also increase power dissipation.

The minimum supply voltage is generally selected to ensure a reliable operation of the integrated circuits, and is often specified based on the manufacturing technology used. In one embodiment, a minimum voltage of 1.1V is specified. As described above with reference to FIG. 3, power management block 120 provides the programmable voltage levels with in the range of the maximum and minimum voltage bounds. For example, power management block 120 provides the programmable voltage levels of 1.35V, 1.42V, 1.5V, 1.55V, 1.65V. A lookup table may be prepared using the programmable voltage levels, which is then used to select the optimal voltage level to apply as described below.

12. Lookup Tables

Figure 10:
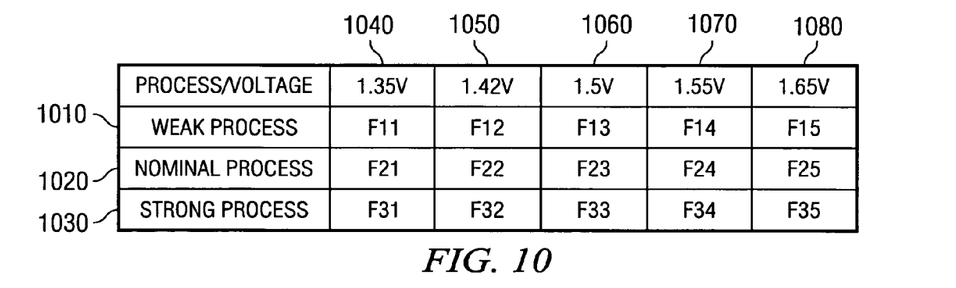
FIG. 10 is a lookup table depicting the details of the frequency of operation of a GRO at different process corners in one embodiment.
Figure 11:
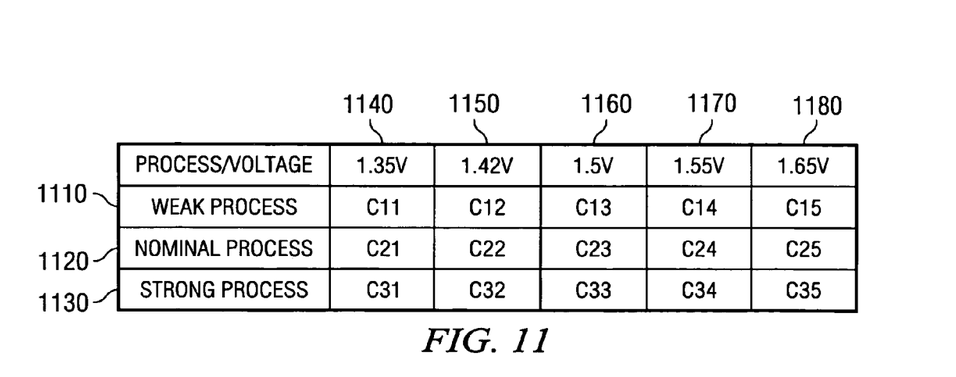
FIG. 11 is a lookup table depicting the details of counter values for the corresponding frequencies depicted in lookup table of FIG. 10 at different process corners for various programmable voltage levels.

FIGS. 10 and 11 are lookup tables, each depicting the performance of GRO 310-1 at different process corners for various programmable voltage levels in one embodiment. In particular, FIG. 10 contains lookup table 1000 illustrating the details of the frequency of operation of GRO 310-1 and FIG. 11 contains lookup table 1100 illustrating the details of counter values for the corresponding frequencies depicted in lookup table 1000 at different process corners for various programmable voltage levels. For illustration, the description is provided with reference to GRO 310-1, however, the same lookup tables may be used in relation to other GROs 320-2 through 310-4 as well.

Continuing with reference to FIG. 10, lookup table 1000 is shown containing 3 rows 1010, 1020 and 1030 and five columns 1040, 1050, 1060, 1070 and 1080. Rows 1010, 1020 and 1030 indicate the frequency of operation of GRO 310-1 at weak, nominal and strong process corners respectively. Columns 1040 through 1080 indicate various programmable voltage levels. In an embodiment, GRO 310-1 is initially operated at weak, nominal and strong process corners for different programmable supply voltage levels. The corresponding frequency of the output signal on path 312-1 is noted down, which is indicated in lookup table 1000. For example, the frequencies represented by output signal 312-1 are shown as F11, F12, F13, F14 and F15 in row 1010 corresponding to respective programmable voltage levels 1.35V, 1.42V, 1.5V, 1.55V and 1.65V and a weak process corner.

The frequencies corresponding to nominal process corner and programmable voltage levels 1.35V, 1.42V, 1.5V, 1.55V and 1.65V are respectively shown as F21, F22, F23, F24 and F25 in row 1020. Similarly, the frequencies are shown as F31, F32, F33, F34 and F35 in row 1020 corresponding to respective programmable voltage levels 1.35V, 1.42V, 1.5V, 1.55V and 1.65V and a strong process corner.

Continuing with reference to FIG. 11, lookup table 1100 is shown containing 3 rows 1110, 1120 and 1130 and five columns 1140, 1150, 1160, 1170 and 1180. Rows 1110, 1120 and 1130 indicate count values at weak, nominal and strong process corners respectively. Columns 1140 through 1180 indicate various programmable voltage levels. The count values correspond to the frequencies depicted in lookup table 1000 and may be determined as described below.

As described above, counter 670 counts the number of cycles in clock signal 352 during the high period of the GRO output signal 312-1. Assuming that the frequency of clock signal 352 and GRO output signal 312-1 are represented by Fref and Fring respectively, and the duty cycle of GRO output signal is represented by D, then the time period of clock signal 352 is Tref equaling 1/Fref and of GRO output signal 312-1 is Tring equaling 1/Fring. Then, the time duration (Thigh) for which GRO output signal 312-1 is high is given by equation (1).

Thigh=Tring×D% Equation (1) The count value (Cring) representing the propagation delay of GRO 310-1 may be obtained by dividing Thigh with Tref as given by equation (2).

Cring=(Tring×D%)/Tref Equation (2) Equation (2) can be rewritten by representing Tref and Tring in terms of Fref and Fring as given by equation (3).

Cring=(Fref×D%)/Fring Equation (3) Thus, the count values corresponding to frequencies in table 1000 can be determined using equation (3) by replacing Fring with the corresponding frequency and D with 50. For example, the count value (C11) corresponding to F11 is given by equation (4).

C11=(Fref×D%)/F11 Equation (4) Similarly, all the count values corresponding to the frequencies in table 1000 are determined and are depicted as shown in table 1100. Lookup table 1100 may be stored in RAM 340, which may be further used to determine the process corner using the count value determined by monitor block 320. Accordingly, the manner in which the process corner may be determined is described below.

13. Determining the Process Corner

Figure 12:
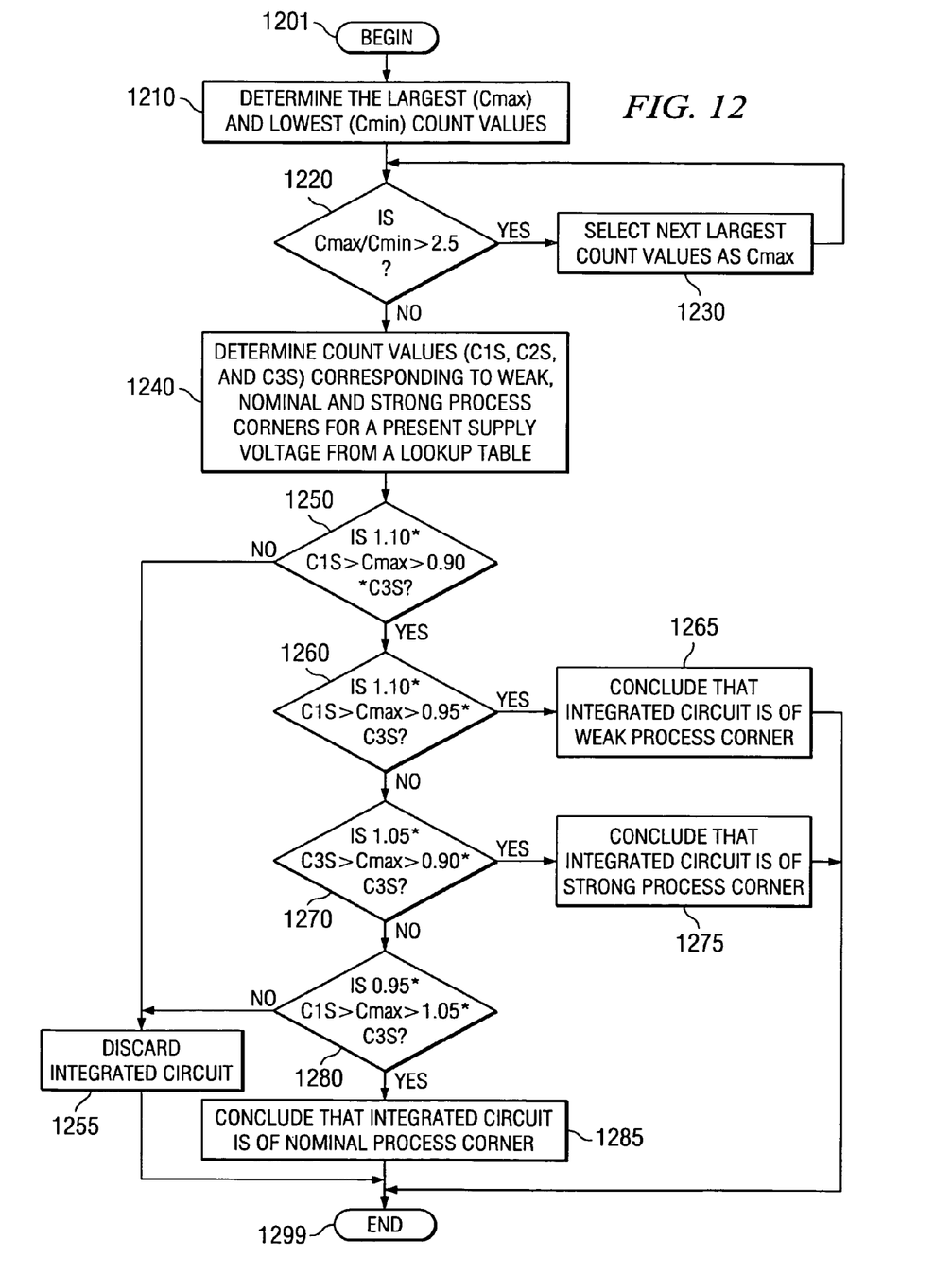
FIG. 12 is a flowchart illustrating the manner in which the process corner may be determined using a lookup table in one embodiment.

FIG. 12 is a flowchart illustrating the manner in which the process corner may be determined in an embodiment of the present invention. The method may be performed by CPU 330 of FIG. 3. The method begins in step 1201, in which control immediately passes to step 1210.

In step 1210, the largest (Cmax) and lowest (Cmin) count values are determined among the count values received from monitor block 320. As described above with reference to FIG. 3, CPU 330 receives four count values representing the propagation delay of each GRO 310-1 through 310-4. The Cmax and Cmin among the four count values are determined.

In step 1220, a determination is made as to whether the ratio of Cmax to Cmin is greater than expected process range. In an embodiment, the expected process range is 2.5 and if the ratio is greater than 2.5, then the die may not be used. However, the usability of a die may be tested earlier and hence the ratio greater than 2.5 indicates defective GRO. Accordingly, control passes to step 1230 if the ratio is greater than 2.5, else control passes to step 1240.

In step 1230, next largest count value is selected as Cmax since the GRO that generates the largest count value is determined to be defective. Control then passes back to step 1220. In step 1240, the count values (C1S, C2S and C3S) corresponding to weak, nominal and strong process corners for the present supply voltage are determined from a lookup table. Assuming that the present supply voltage is 1.5V, the count values C1S, C2S and C3S from lookup table 1100 equal C13, C23 and C33 respectively.

The process corner may be determined by checking the range in which Cmax lies in between C11 and C13 values. The range is determined based on the characteristics of the GRO. Steps 1250 through 1280 determine the process corner of the die as described below.

In step 1250, a determination is made as to whether 1.10*C1S>Cmax>0.90*C3S, wherein '*' represents multiplication operator and '>' represents greater than logical operator. If Cmax is less than 1.10*C1S and higher than 0.90*C3S, then the die lies in any of the three process corners and control passes to step 1260, else control passes to step 1255.

In step 1255, the die is discarded as being of an unacceptable process corners (and thus unusable), and control passes to step 1299.

In step 1260, a determination is made as to whether 1.10*C1S>Cmax>0.95*C3S. If Cmax is less than 1.10*C1S and higher than 0.95*C3S, control passes to step 1265, else control passes to step 1270. In step 1265, the die is concluded to be of a weak process corner. Control then passes to step 1299.

In step 1270, a determination is made as to whether 1.05*C3S>Cmax>0.90*C3S. If Cmax is less than 1.05*C3S and higher than 0.90*C3S, control passes to step 1275, else control passes to step 1280. In step 1275, the die is concluded to be of a strong process corner. Control then passes to step 1299.

In step 1280, a determination is made as to whether 0.95*C1S >Cmax>1.05*C3S. If Cmax is less than 0.95*C1S and higher than 1.05*C3S, control passes to step 1285, else control passes to step 1255. In step 1285, the die is concluded to be of a nominal process corner. Control then passes to step 1299, in which the method ends.

It should be understood that the multipliers (i.e., 0.95, 1.05, 1.10 and 0.90) may be determined experimentally for specific GROs and manufacturing technologies, and the values used are suitable for an example scenario.

Thus, look up table 1100 may be used to determine the process corner of die 100. Lookup table 1100 may also be used to determine the supply voltage to be applied based on the process corner. Accordingly, the manner in which the supply voltage may be determined is described below.

14. Determining the Supply Voltage

In one embodiment, if the process corner is determined to be weak or strong, the default supply voltage is changed such that the die performs as in the nominal process corner. The change in the supply voltage may be determined using lookup table 1100 as described below.

The die is determined to be operated at nominal process corner if the count value obtained from GROs would substantially equal the count value of nominal process corner for the present supply voltage as indicated in lookup table. To operate a die with weak or strong process corner similar to the nominal process corner, the supply voltage has to be changed such that the count value that would be obtained has to be equal the count value corresponding to the nominal process corner at the present supply voltage.

For example, if the present supply voltage is 1.5V and the process corner is weak, to operate the die similar to nominal process corner, the count value needs to be equal C23 as shown in lookup table 1100 corresponding to nominal process corner. The corresponding supply voltage value may be determined as described below.

To determine the supply voltage value, the difference values are calculated using lookup table 1100 by subtracting the count value corresponding to the nominal process corner from the count values corresponding to the determined process corner. The supply voltage may equal the programmable voltage level corresponding to the difference value closest to zero. In the illustrative example, the difference values are (|C11−C23|), (|C12−C23|), (|C13−C23|), (|C14−C23|), (|C15−C23|), wherein '||' indicates the absolute values, corresponding to supply voltage values of (1.35V, 1.42V, 1.5V, 1.55V, and 1.65V). If (|C14−C23|) is closest to zero, then 1.55V is determined to be the supply voltage.

After determining the supply voltage, the method of FIG. 12 is performed to validate the supply voltage value corresponding to the process corner. If the process corner is determined to be nominal process corner, then the supply voltage is correct value, else the frequency of clock signal 352 may be increased to increase the resolution of measurements. The resolution may be increased by changing the frequency of a PLL, which generates clock signal 352 or by dividing the output signals of GROs 310-1 through 310-4 by a factor (e.g., 2).

15. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A device comprising:
an application block implementing a user application;
a power management block providing a supply voltage to said application block;
a measurement block measuring a characteristic comprising a propagation delay of a corresponding signal at a plurality of portions on said application block to generate corresponding measured values, said measurement block comprising:
plurality of gated ring oscillators (GROs), wherein each of said plurality of GROs is located at a corresponding one of said plurality of portions, said plurality of GROs generating a corresponding number of signals;
a monitor block generating said measured values representing a propagation delay at said plurality of portions, wherein said processing unit determines a strength of process corner of said application block based on said measured values, and said power management block adjusts said supply voltage to an optimum value based on said strength, said monitor block comprising:
a multiplexer to select one of said signals;
a transition detector generating pulses representing transitions in an output generated by said multiplexor;
a counter receiving a clock signal and counting a number of clock periods of said clock signal between two successive transitions generated by said transition detector to generate a measured value corresponding to said output, wherein said measured value is comprised in said plurality of measured values;
a capture register storing said measured value; and
a processing unit interfacing with said power management block to adjust said supply voltage to an optimum value based on said measured values.

2. A device comprising:
an application block implementing user application;
a power management block providing a supply voltage to said application block;
a measurement block measuring a characteristic comprising a propagation delay of a corresponding signal at a plurality of portions on said application block to generate corresponding measured values, said measurement block comprising:
plurality of gated ring oscillators (GROs), wherein each of said plurality of GROs is located at a corresponding one of said plurality of portions, said plurality of GROs generating a corresponding number of signals;
a monitor block generating said measured values representing said propagation delay at said plurality of portions, wherein said processing unit determines a strength of process corner of said application block based on said measured values, and said power management block adjusts said supply voltage to an optimum value based on said strength, said monitor block comprising:
a multiplexer to select one of said signals; and
a counter generating a measured value by counting number of cycles in an output generated by said multiplexer during a fixed time period, wherein said measured value is comprised in said plurality of measured values.

3. A device comprising:
an application block implementing a user application;
a power management block providing a supply voltage to said application block wherein said power management block comprises:
a register programmed to store an adjustment value, wherein said adjustment value causes said power management block to provide said optimum value of said supply voltage while initializing said single die;
a capacitor charging to said optimum value of said supply voltage;
a second multiplexer selecting one of said adjustment value or an output value of said processing unit as a multiplexer output;
a controller generating pulses based on said multiplexer output, a reference voltage and present value of said supply voltage, wherein said controller further generates a first signal if said output of said second multiplexer changes or while said capacitor is charging to said optimal value, said controller sending a second signal after said capacitor is charged to said optimum value;

a measurement block measuring a characteristic comprising a propagation delay of a corresponding signal at a plurality of portions on said application block to generate corresponding measured values, said measurement block comprising:

a monitor block generating said measured values representing said propagation delay at said plurality of portions, wherein said processing unit determines a strength of process corner of said application block based on said measured values, and said power management block adjusts said supply voltage to an optimum value based on said strength; and a processing unit interfacing with said power management block to adjust said supply voltage to an optimum value based on said measured values.

4. The device of claim 1, 2, or 3, wherein said application block, said measurement block, said power management block and said processing unit are fabricated on a single die.

5. The device of claim 1, 2, or 3, wherein a high value of said measured values indicates a weak process corner at a corresponding portion, and a low value of said measured values indicates a strong process corner at a corresponding portion.

6. The device of claim 5, wherein said processing unit is operable to:

select a maximum value and a minimum value from said measured values; and determine whether to increase or decrease said supply voltage based on said maximum value, wherein said power management block increases said supply voltage if said maximum value has said high value and decreases said supply voltage if said maximum value has said low value.

7. The device of claim 6, wherein said processing unit is further operable to:

check whether a ratio of said maximum value and said minimum value exceeds a pre-specified threshold; and use a next highest value instead of said maximum value to perform said determine if said ratio exceeds said pre-specified threshold.

8. The device of claim 6, wherein said processing unit is further operable to:

receive a first value, a second value and a third value corresponding to a weak process corner, a nominal process corner and a strong process corner respectively for a present supply voltage; and discard said single die as being unusable if said maximum value is more than a first multiplier of said first value or if said maximum value is less than a second multiplier of said third value.

9. The device of claim 6, wherein said processing unit determines to increase said supply voltage if said maximum value is less than a first multiplier of said first value and if said maximum value is more than a second multiplier of said third value.

10. The device of claim 6, wherein said processing unit determines to decrease said supply voltage if said maximum value is less than a first multiplier of said third value and if said maximum value is more than a second multiplier of said third value.

11. The device of claim 10, further comprises a random access memory (RAM) storing a lookup table containing measured values corresponding to a weak process corner, a nominal process corner and a strong process corner for a plurality of pre-determined levels of said supply voltage and said RAM provides said first value, said second value and said third value.

12. The device of claim 11, wherein said maximum value comprises the largest value among said plurality of measured values and said minimum value comprises the smallest value among said plurality of measured values.

13. The device of claim 3, wherein said power management block further comprises:

a current limiter receiving said first signal and said second signal, and generating a third signal indicating a normal mode or a constant current mode; and a power stage receiving said third signal and said pulses, and generating high power pulses in said normal mode, and providing current to said capacitor in said constant current mode.

* * * * *